(12) United States Patent
Lentschke et al.

(10) Patent No.: US 7,361,843 B2
(45) Date of Patent: Apr. 22, 2008

(54) AC COUPLING OF POWER PLANE SECTIONS USING IMPROVED CAPACITANCE STITCHING MATERIAL

(75) Inventors: Ernest Lentschke, Round Rock, TX (US); Jeffrey C. Hailey, Austin, TX (US); Raymond McCormick, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 26 days.

(21) Appl. No.: 11/236,960

(22) Filed: Sep. 28, 2005

(65) Prior Publication Data

US 2007/0068699 A1 Mar. 29, 2007

(51) Int. Cl.
*H05K 1/03* (2006.01)
(52) U.S. Cl. .................. 174/255; 174/258; 174/259; 361/792; 361/793; 361/794; 361/795; 29/832
(58) Field of Classification Search ........ 174/255–260; 257/668, 700, 758; 361/780, 763, 792–795; 428/325, 327, 339; 438/637; 29/832, 592, 29/592.1
See application file for complete search history.

(56) References Cited

U.S. PATENT DOCUMENTS

| | | | | |
|---|---|---|---|---|
| 5,144,747 A | * | 9/1992 | Eichelberger | 29/834 |
| 5,428,499 A | * | 6/1995 | Szerlip et al. | 361/328 |
| 5,451,720 A | | 9/1995 | Estes et al. | 174/250 |
| 5,500,789 A | | 3/1996 | Miller et al. | 361/816 |
| 5,912,809 A | * | 6/1999 | Steigerwald et al. | 361/780 |
| 5,962,122 A | * | 10/1999 | Walpita et al. | 428/325 |
| 6,081,026 A | * | 6/2000 | Wang et al. | 257/700 |
| 6,150,895 A | | 11/2000 | Steigerwald et al. | 333/12 |
| 6,219,255 B1 | | 4/2001 | Teshome | 361/794 |
| 6,239,485 B1 | * | 5/2001 | Peters et al. | 257/700 |
| 6,349,038 B1 | | 2/2002 | Hailey | 361/794 |
| 6,706,974 B2 | | 3/2004 | Chen et al. | 174/261 |
| 6,710,255 B2 | * | 3/2004 | Ross et al. | 174/255 |
| 2002/0076919 A1 | * | 6/2002 | Peters et al. | 438/637 |
| 2004/0119147 A1 | * | 6/2004 | Roth et al. | 257/668 |
| 2004/0201971 A1 | * | 10/2004 | Fessler et al. | 361/780 |
| 2005/0087877 A1 | * | 4/2005 | Han et al. | 257/758 |
| 2006/0120059 A1 | | 6/2006 | Farkas et al. | 361/777 |
| 2006/0133057 A1 | * | 6/2006 | McGregor et al. | 361/763 |

* cited by examiner

*Primary Examiner*—Diego Gutierrez
*Assistant Examiner*—Xiaoliang Chen
(74) *Attorney, Agent, or Firm*—Baker Botts L.L.P.

(57) ABSTRACT

An information handling system has a printed circuit board with a split power plane having a plurality of sections that may be used for distributing different voltages on a single conductive foil layer of the printed circuit board to components on the printed circuit board. Capacitive coupling of the split power plane sections may be enhanced with a high dielectric fill between the portions.

19 Claims, 3 Drawing Sheets

AC COUPLING OF POWER PLANE SECTIONS USING IMPROVED CAPACITANCE STITCHING MATERIAL

TECHNICAL FIELD

The present disclosure relates generally to information handling systems, and more particularly, to AC signal coupling of printed circuit board power planes of the information handling systems.

BACKGROUND

As the value and use of information continues to increase, individuals and businesses seek additional ways to process and store information. One option available to users are information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems, e.g., computer, personal computer workstation, portable computer, computer server, print server, network router, network hub, network switch, storage area network disk array, RAID disk system and telecommunications switch.

The information handling system comprises a plurality of subsystems, e.g., processor blades, disk controllers, etc., that may be fabricated on printed circuit boards. These subsystems operate at certain direct current (DC) voltages and currents. Generally, these DC voltages and currents may be supplied through power planes in the printed circuit boards.

SUMMARY

Printed circuit boards of the subsystems in the information handling system may have a plurality of conductive foil layers separated by insulating layers. The conductive foil layers may be used for power distribution, ground and signal routing. In order to reduce cost, complexity and board thickness, the number of conductive foil layers is kept to a minimum when fabricating the printed circuit board. The subsystem circuit functions may require a plurality of different voltages so power distribution may be segregated into a split power plane on a single conductive foil layer of the printed circuit board instead of a plurality of power distribution layers, one for each voltage. In addition, signal lines of a signal layer(s) may be routed over the split power plane instead of over a continuous ground plane. When signal lines are run over the split power plane there may be electromagnetic interference and/or a signal integrity problems, e.g., noise, transients, etc. Prior technology printed circuit boards have used stitching capacitors connected across the splits in the various segments of the split power plane in close proximity to the signal lines for reducing electromagnetic interference and/or a signal integrity problems. However, using stitching capacitors in this manner is costly and uses up valuable printed circuit board space. What is needed is a more cost effective way of reducing electromagnetic interference and/or a signal integrity problems with signal lines crossing over the splits in the various segments of the split power plane of a printed circuit board.

According to a specific example embodiment of this disclosure, an information handling system having at least one printed circuit board may comprise: at least one printed circuit board having a non-conductive substrate, a conductive power plane on the non-conductive substrate, the conductive power plane comprising a plurality of power sections that are insulated from one another, each of the plurality of power sections having an edge that is substantially coterminous with at least one other edge of the plurality of power sections a high dielectric constant filler between the substantially coterminous edges of the plurality of power sections, a conductive signal plane running over at least some of the plurality of power sections and insulated therefrom; a ground plane insulated from the conductive power plane and the conductive signal plane; and components connected to the conductive power plane, the conductive signal plane and the conductive ground plane.

According to another specific example embodiment of this disclosure, a printed circuit board may comprise: a non-conductive substrate, a conductive power plane on the non-conductive substrate, the conductive power plane comprising a plurality of power sections that are insulated from one another, each of the plurality of power sections having an edge that is substantially coterminous with at least one other edge of the plurality of power sections a high dielectric constant filler between the substantially coterminous edges of the plurality of power sections, a conductive signal plane running over at least some of the plurality of power sections and insulated therefrom, and a ground plane insulated from the conductive power plane and the conductive signal plane.

According to yet another specific example embodiment of this disclosure, a method of making a printed circuit board having AC coupling of power plane sections may comprise the steps of: providing a non-conductive substrate, applying a conductive power plane on the non-conductive substrate, the conductive power plane comprising a plurality of power sections that are insulated from one another, each of the plurality of power sections having an edge that is substantially coterminous with at least one other edge of the plurality of power sections, applying a high dielectric constant filler between the substantially coterminous edges of the plurality of power sections, applying a conductive signal plane running over at least some of the plurality of power sections and insulated therefrom and applying a ground plane insulated from the conductive power plane and the conductive signal plane.

BRIEF DESCRIPTION OF THE DRAWINGS

A more complete understanding of the present disclosure thereof may be acquired by referring to the following description taken in conjunction with the accompanying drawings wherein.

Figure 1:
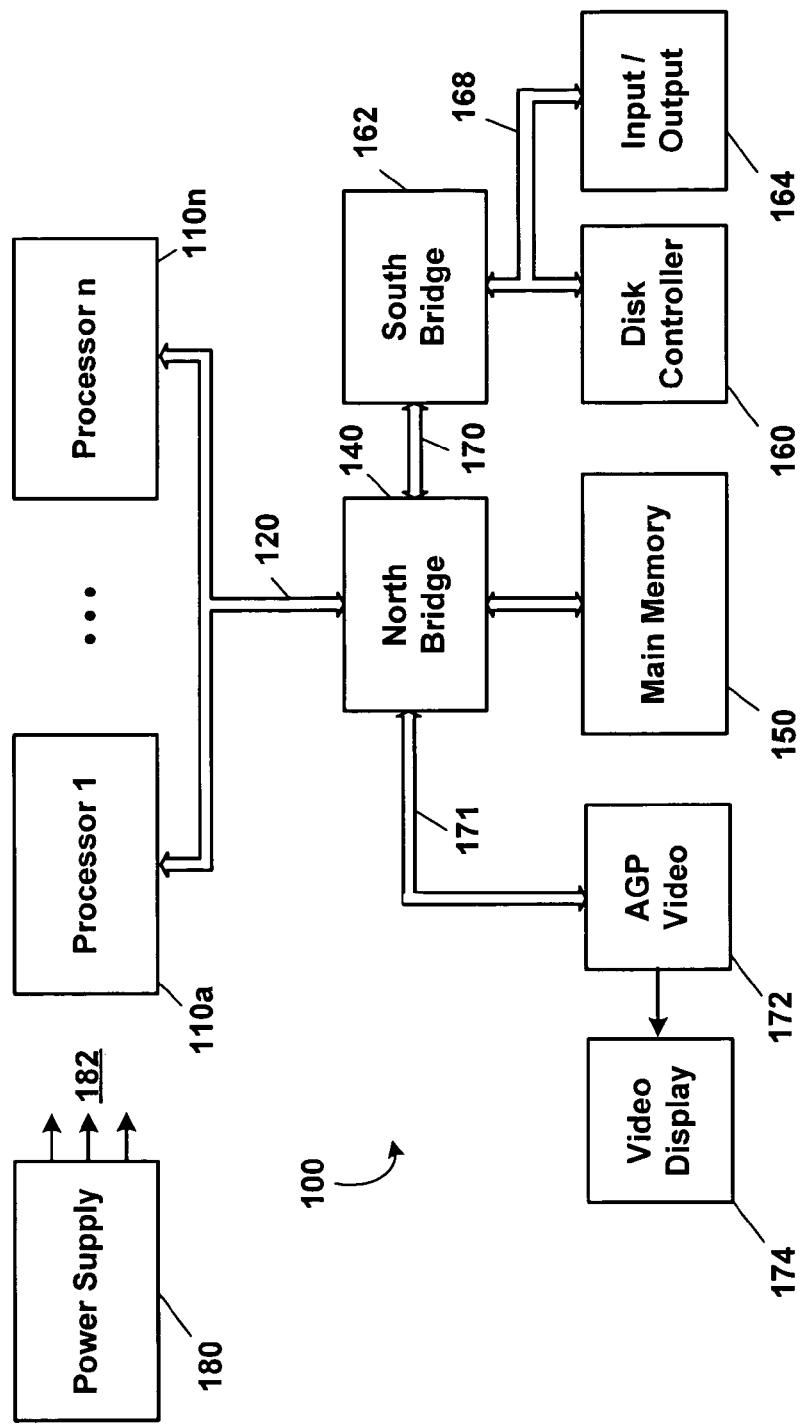
FIG. 1 is a schematic block diagram of an information handling system.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU), hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is an information handling system having electronic components mounted on at least one printed circuit board (PCB) (motherboard) (not shown) and communicating data and control signals therebetween over signal buses, according to a specific example embodiment of the present disclosure. In one example embodiment, the information handling system is a computer system. The information handling system, generally referenced by the numeral 100, comprises a plurality of physical processors 110, generally represented by processors 110a-110n, coupled to a host bus(es) 120. A north bridge 140, which may also be referred to as a memory controller hub or a memory controller, is coupled to a main system memory 150. The north bridge 140 is coupled to the plurality of processors 110 via the host bus(es) 120. The north bridge 140 is generally considered an application specific chip set that provides connectivity to various buses, and integrates other system functions such as a memory interface. For example, an Intel 820E and/or 815E chip set, available from the Intel Corporation of Santa Clara, Calif., provides at least a portion of the north bridge 140. The chip set may also be packaged as an application specific integrated circuit (ASIC). The north bridge 140 typically includes functionality to couple the main system memory 150 to other devices within the information handling system 100. Thus, memory controller functions such as main memory control functions typically reside in the north bridge 140. In addition, the north bridge 140 provides bus control to handle transfers between the host bus 120 and a second bus(es), e.g., PCI bus 170, AGP bus 171 coupled to a video graphics interface 172 which drives a video display 174. A third bus(es) 168 may also comprise other industry standard buses or proprietary buses, e.g., ISA, SCSI, I$^2$C, SPI, USB buses through a south bridge(s) (bus interface) 162. A disk controller 160 and input/output interface 164 may be coupled to the third bus(es) 168. One or more power supplies 180 may supply direct current (DC) voltage outputs 182 to the aforementioned components (subsystems) of the information handling system 100.

Figure 2:
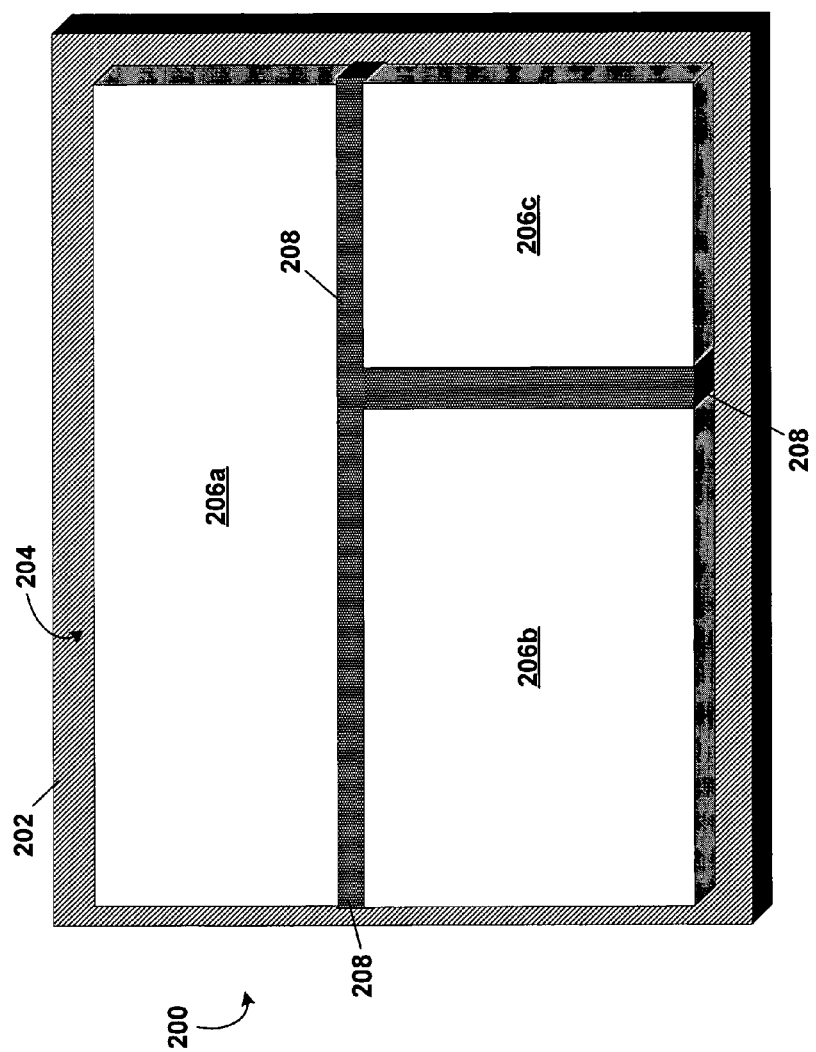
FIG. 2 is a schematic plan view diagram of a printed circuit board having a split power plane on a single conductive foil layer, according to a specific example embodiment of the present disclosure.

Referring to FIG. 2, depicted is a schematic plan view diagram of a printed circuit board having a split power plane on a single conductive foil layer, according to a specific example embodiment of the present disclosure. A printed circuit board, generally represented by the numeral 200, comprises at least one non-conductive substrate 202, a conductive power plane, generally represented by the numeral 204 having a plurality of conductive sections 206, and a non-conductive high dielectric constant filler 208 located between the plurality of sections 206. The filler 208 may comprise an epoxy that may have quartz or mica particles, or any other non-conductive high dielectric constant material.

Figure 3:
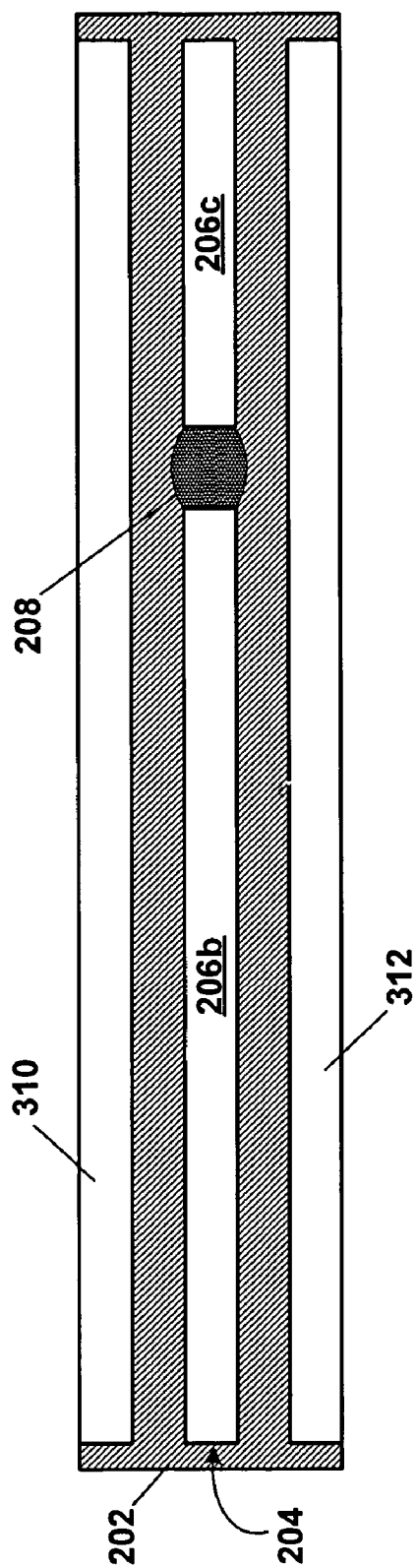
FIG. 3 is a schematic elevation view diagram of the printed circuit board shown in FIG. 2.

Referring to FIG. 3, depicted is a schematic elevation view diagram of the printed circuit board shown in FIG. 2. The high dielectric constant filler 208 substantially fills a void between the plurality of sections (e.g., 206b and 206c shown). Other conductive layers 310 and 312 may be located above and below, respectively, the power plane 204. The other conductive layers 310 and/or 312 may be used for signal distribution, a ground plane, and/or additional power distribution.

Capacitance coupling between the plurality of sections 206 may be determined by the thickness times the length of the sections 206 that are substantially coterminous with each other, times the dielectric constant of the filler 208 divided by the distance between the substantially coterminous edges of the sections 206. Thus the value of the capacitive coupling (capacitive stitching) may be increased by spacing the substantially coterminous edges of the sections 206 closer together and/or using a higher dielectric constant filler 208 between the substantially coterminous edges of the sections 206. In addition, the thicker and/or longer the substantially coterminous edges of the sections 206 are, the larger the stitching capacitance value.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An information handling system having at least one printed circuit board, said information handling system comprising:
    at least one printed circuit board comprising
        a non-conductive substrate, a conductive power plane on the non-conductive substrate, the conductive power plane comprising a plurality of power sections that are insulated from one another, each of the plurality of power sections having an edge that is substantially coterminous with at least one other edge of the plurality of power sections, wherein the plurality of power sections have a surface area, a high dielectric constant filler between the substantially coterminous edges of the plurality of power sections, a conductive signal plane running over at least some of the plurality of power sections and insulated therefrom, and a ground plane insulated from the conductive power plane and the conductive signal plane, wherein the ground plane has a surface area substantially the same size as the surface area of the plurality of power sections; and components connected to the conductive power plane, the conductive signal plane and the conductive ground plane.

2. The information handling system according to claim 1, wherein an area of the substantially coterminous edges of the plurality of power sections is the length of the substantially coterminous edges times the thickness of the power plane.

3. The information handling system according to claim 2, wherein a stitching capacitance is proportional to an area of the substantially coterminous edges of the plurality of power sections times the dielectric constant of the high dielectric constant filler therebetween.

4. The information handling system according to claim 3, wherein the stitching capacitance is inversely proportional to a distance between the substantially coterminous edges of the plurality of power sections.

5. The information handling system according to claim 1, wherein the high dielectric constant filler comprises quartz particles.

6. The information handling system according to claim 5, wherein the high dielectric constant filler comprises a high concentration of quartz particles.

7. The information handling system according to claim 1, wherein the high dielectric constant filler comprises mica particles.

8. The information handling system according to claim 7, wherein the high dielectric constant filler comprises a high concentration of quartz mica particles.

9. The information handling system according to claim 1, wherein the high dielectric constant filler comprises filled epoxy.

10. A printed circuit board, comprising:
a non-conductive substrate;
a conductive power plane on the non-conductive substrate, the conductive power plane comprising a plurality of power sections that are insulated from one another, each of the plurality of power sections having an edge that is substantially coterminous with at least one other edge of the plurality of power sections, wherein the plurality of power sections have a surface area;
a high dielectric constant filler between the substantially coterminous edges of the plurality of power sections;

a conductive signal plane running over at least some of the plurality of power sections and insulated therefrom; and a ground plane insulated from the conductive power plane and the conductive signal plane, wherein the ground plane has a surface area substantially the same size as the surface area of the plurality of power sections.

11. The printed circuit board according to claim 10, wherein an area of the substantially coterminous edges of the plurality of power sections is the length of the substantially coterminous edges times the thickness of the power plane.

12. The printed circuit board according to claim 11, wherein a stitching capacitance is proportional to an area of the substantially coterminous edges of the plurality of power sections times the dielectric constant of the high dielectric constant filler therebetween.

13. The printed circuit board according to claim 12, wherein the stitching capacitance is inversely proportional to a distance between the substantially coterminous edges of the plurality of power sections.

14. The printed circuit board according to claim 10, wherein the high dielectric constant filler comprises quartz particles.

15. The printed circuit board according to claim 14, wherein the high dielectric constant filler comprises a high concentration of quartz particles.

16. The printed circuit board according to claim 10, wherein the high dielectric constant filler comprises mica particles.

17. The printed circuit board according to claim 16, wherein the high dielectric constant filler comprises a high concentration of quartz mica particles.

18. The printed circuit board according to claim 10, wherein the high dielectric constant filler comprises filled epoxy.

19. A method of making a printed circuit board having AC coupling of power plane sections, comprising the steps of:
providing a non-conductive substrate;
applying a conductive power plane on the non-conductive substrate, the conductive power plane comprising a plurality of power sections that are insulated from one another, each of the plurality of power sections having an edge that is substantially coterminous with at least one other edge of the plurality of power sections, wherein the plurality of power sections have a surface area;
applying a high dielectric constant filler between the substantially coterminous edges of the plurality of power sections;
applying a conductive signal plane running over at least some of the plurality of power sections and insulated therefrom; and
applying a ground plane insulated from the conductive power plane and the conductive signal plane, wherein the ground plane has a surface area substantially the same size as the surface area of the plurality of power sections.

* * * * *